(12) United States Patent
Weissman et al.

(10) Patent No.: US 7,912,159 B2
(45) Date of Patent: Mar. 22, 2011

(54) ENHANCED DENOISING SYSTEM

(75) Inventors: Itschak Weissman, Menlo Park, CA (US); Erik Ordentlich, San Jose, CA (US); Gadiel Seroussi, Cupertino, CA (US); Marcelo Weinberger, San Jose, CA (US); Sergio Verdu, Princeton, NJ (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 2006 days.

(21) Appl. No.: 10/765,542

(22) Filed: Jan. 26, 2004

(65) Prior Publication Data
US 2005/0163267 A1    Jul. 28, 2005

(51) Int. Cl.
*H04L 27/08* (2006.01)
(52) U.S. Cl. ........ 375/346; 714/746; 714/774; 714/778; 714/752; 714/800; 375/316; 375/240.2; 375/350
(58) Field of Classification Search .................. 714/746, 714/800, 752, 763, 780, 755, 756, 774, 778; 375/346, 316, 350, 240.2, 240.27
See application file for complete search history.

(56) References Cited

U.S. PATENT DOCUMENTS

| | | |
|---|---|---|
| 5,533,033 A | 7/1996 | Ratner |
| 5,596,565 A | 1/1997 | Yonemitsu et al. |
| 5,764,658 A | 6/1998 | Sekiguchi et al. |
| 6,058,216 A | 5/2000 | Endo et al. |
| 6,161,209 A | 12/2000 | Moher |
| 6,199,186 B1 | 3/2001 | Chen et al. |
| 6,307,487 B1 * | 10/2001 | Luby ............................... 341/50 |
| 6,848,080 B1 | 1/2005 | Lee et al. |
| RE38,871 E | 11/2005 | Sekiguchi et al. |
| 7,047,472 B2 | 5/2006 | Weissman et al. |
| 7,266,466 B2 * | 9/2007 | Lemma et al. ................ 702/106 |
| 2004/0010746 A1 * | 1/2004 | Lucas et al. ................... 714/781 |
| 2004/0085917 A1 * | 5/2004 | Fitton et al. ................... 370/292 |

FOREIGN PATENT DOCUMENTS

| | | |
|---|---|---|
| JP | 07-177199 | 7/1995 |
| JP | 10-079938 | 3/1998 |
| JP | 2005-124198 A | 5/2005 |

OTHER PUBLICATIONS

Tsachy Weissman et al.,"Universal Discrete Denoising",2002,"ITW2002", pp. 11-14.*

* cited by examiner

*Primary Examiner* — David C. Payne
*Assistant Examiner* — Rahel Guarino

(57) ABSTRACT

A method and apparatus for processing a received digital signal that has been corrupted by a channel is disclosed. The method includes storing the received digital signal and receiving a partially corrected sequence of symbols that includes an output of a preliminary denoising system operating on the received digital signal. Information specifying a signal degradation function that measures the signal degradation that occurs if a symbol having the value I is replaced by a symbol having the value J is utilized to generate a processed digital signal by replacing each symbol having a value I in a context of that symbol in the received digital signal with a symbol having a value J if replacement reduces a measure of overall signal degradation in the processed digital signal relative to the received digital signal as measured by the degradation function and the partially corrected sequence of symbols.

14 Claims, 3 Drawing Sheets

ENHANCED DENOISING SYSTEM

FIELD OF THE INVENTION

The present invention relates to signal processing, and more particularly, to the correction of errors introduced into a signal by the transmission or processing of that signal.

BACKGROUND OF THE INVENTION

The present invention can be more easily understood in terms of a simple exemplary system. Consider a telephone conversation in which a person talks into a microphone whose output is digitized and then transmitted to a second person via various telephone lines and switch systems. The speaker at the second person's location receives a sequence of digital values that are then played back to the second person. In general, the received sequence will differ from the transmitted sequence because of errors introduced by the transmission system, digital-to-analog converters, and analog to digital converters. For example, noise in the transmission system results in some of the digital values in the transmitted sequence being altered. One goal of a denoising system is to remove as many of these noise errors as possible.

The simple example discussed above is an example of a more general problem that is encountered in a wide range of applications. In general, an input digital signal that consists of a sequence of "symbols" is transmitted through a "communication link" and is received as an output digital signal at the output of the communication link. The output digital signal also consists of a sequence of "symbols". Each of the symbols is chosen from a predetermined set of symbols, referred to as an alphabet. The output signal is assumed to be written in the same alphabet as the input signal.

In the simplest case, the signals are binary signals in which the alphabet consists of the symbols "0" and "1". In this case the input and output signals consist of a sequence of 0s and 1s. However, other alphabets are commonly used. For example, a digitized signal in which each symbol is represented by an integer between 0 and M−1 is commonly used in broadband data transmission systems for connecting users to the Internet via a digital subscriber loop (DSL).

While the above examples refer to communication systems, it should be noted that this type of noise problem is present in a number of data processing systems. For example, the storage of data files on a magnetic disk drive can be viewed as the transmission of a digital signal through a communication link, the disk drive. The input signal is a sequence of symbols, e.g., bytes of data, which are chosen from a predetermined alphabet. In the case of byte data, each symbol has an integer value chosen from the set [0, 1, . . . , 255]. The retrieved file from the disk drive also consists of a sequence of symbols chosen from this set. The input signal symbols are processed by the electronics of the disk drive and stored in the form of localized magnetic fields that are read to generate the output signal. Noise in the digital to analog circuitry that converts the symbols to and from the magnetic fields introduces errors into the output signal. In addition, the magnetic fields can be altered during storage by random events that introduce additional errors.

Similarly, digital photography may be viewed as involving the transmission of a signal through a channel that corrupts the signal. In this case, the signal is the image, which is corrupted by noise in the photodetectors.

SUMMARY OF THE INVENTION

The present invention includes a method and apparatus for processing a received digital signal that includes a sequence of symbols that has been corrupted by a channel to generate a processed digital signal. The method includes storing the received digital signal and receiving a partially corrected sequence of symbols that includes an output of a preliminary denoising system operating on the received digital signal. Information specifying a signal degradation function that measures the signal degradation that occurs if a symbol having the value I is replaced by symbol having a value J is utilized to generate a processed digital signal by replacing each symbol having a value I in a context of that symbol in the received digital signal with a symbol having a value J if replacement reduces a measure of overall signal degradation in the processed digital signal relative to the input digital signal as determined using the degradation function and the partially corrected sequence of symbols. The method can be practiced on a dedicated apparatus or on a general purpose data processing system.

DETAILED DESCRIPTION OF THE PREFERRED EMBODIMENTS OF THE INVENTION

The present invention provides a method for reducing the signal degradation resulting from the noise that is introduced into a digital signal when the signal is processed by a system that introduces noise errors. The processing system that introduces the noise will be referred to as the "channel" in the following discussion because such a system is analogous to a transmission channel over which the signal is sent.

Figure 1:
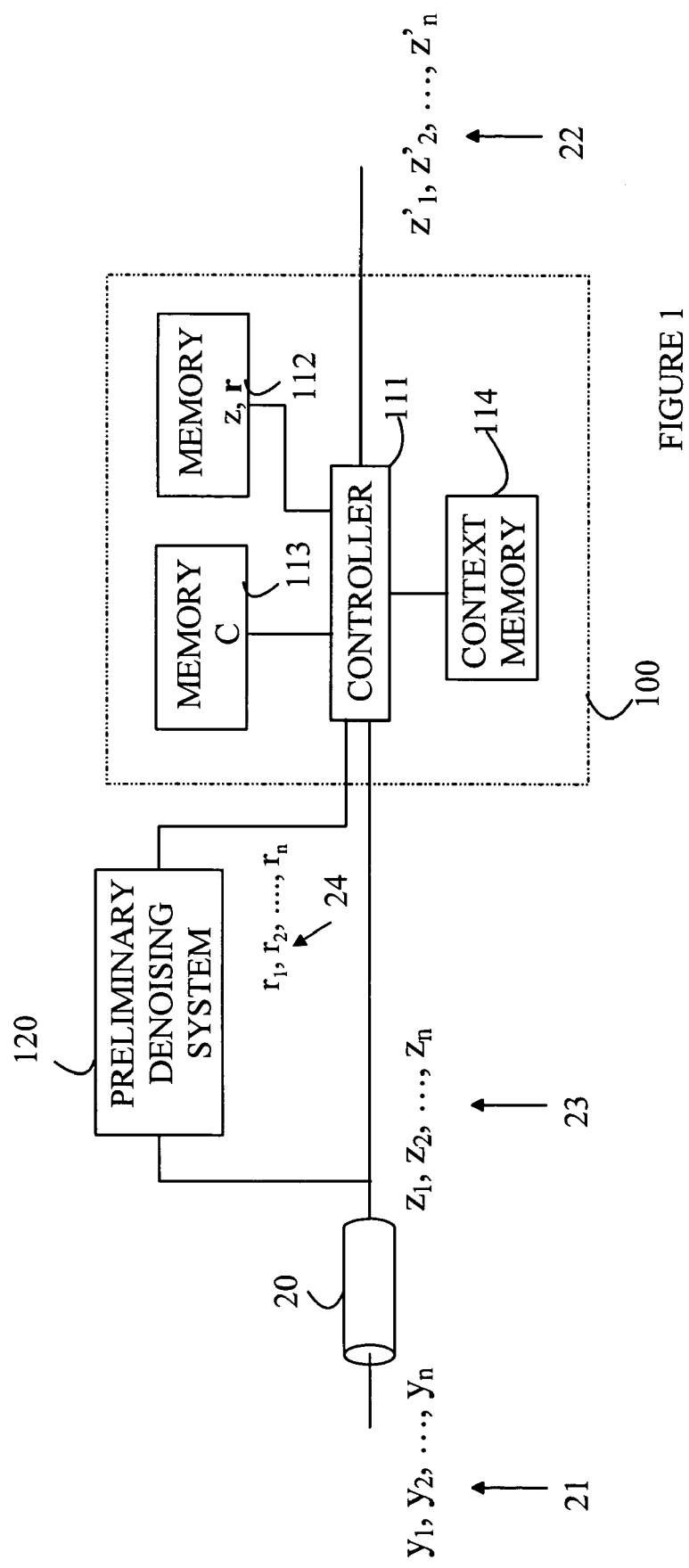
FIG. 1 is a block diagram of a denoising system according to one embodiment of the present invention.

Refer now to FIG. 1, which is a block diagram of a denoising system 100 according to one embodiment of the present invention, operating on a signal 23 that has been corrupted by a channel 20. The channel operates on an input signal 21 comprising a sequence of symbols, $y_1, y_2, \ldots, y_n$ from a known alphabet to generate an output signal 23 that also comprises a sequence of symbols from that alphabet. The noisy output signal will be denoted by the sequence $z_1, z_2, \ldots, z_n$. The noisy output signal symbols are also assumed to be from the same alphabet as the input signal symbols. That is, each symbol can take on a value from 0 to M−1, where M is an integer >1. To simplify the following discussion, sequences of symbols will be denoted in boldface. For example, the sequence $y_1, y_2, \ldots, y_n$ will be denoted by y.

It is assumed that a preliminary denoising system 120 operates on z to generate a first approximation to a denoised signal 24, $r=r_1, r_2, \ldots, r_n$ by changing various members of the z sequence in a manner that is not known to those receiving r. Consider a subsequence of 2k+1 symbols in z that is centered about $z_q$. Here, k is an integer. The manner in which k is chosen will be discussed in more detail below. Denote this subsequence by z(q). That is $z(q)=z_{q-k}, z_{q-k+1}, \ldots z_q, z_{q+1}, \ldots z_{q+k}$. The subsequence z(q) shall sometimes be referred to in what follows as the reference subsequence for index q. Assume that k is chosen such that this subsequence appears at a number of locations in z. That is, z(p)=z(q) for a number of different values of p. The present invention is based on the assumption that if the preliminary denoising system changes the value of $z_q$, it should also change the value of $z_p$ in the same manner for each of the other occurrences of this subsequence.

The present invention examines the output of the preliminary denoising system and determines a value to be assigned to $z_q$ and each of the $z_p$'s based on a measure of the signal degradation that occurs when a symbol is mistakenly replaced by another symbol. This resulting new sequence 22, z', is then output from the present invention. The present invention assumes that there is a quantified measure of the degradation introduced into the output signal by replacing a symbol having the value A in the input signal by a symbol having the value B in the output signal. The degradation may be different for different values of A and B. In the following discussion this degradation measure will be referred to simply as the "degradation" and denoted by C(A,B).

In systems that utilize an alphabet that contains more than two symbols, C(A,B) will often depend on the difference between A and B. For example, consider a digital signal that is generated by converting an analog time varying signal to a sequence of digital values utilizing an 8-bit analog-to-digital converter. The resulting digital signal is a sequence of symbols chosen from an alphabet having 256 symbols corresponding to the digital values 0 through 255. Assume that the output signal is to be converted back into an analog signal and played back to a human observer. The error in the output signal resulting from a symbol being altered by 1 is usually much less than the error resulting from a symbol being altered by a 2, and so on. Hence, the degradation function will depend on the amount by which the symbol is changed in this case.

Figure 2:
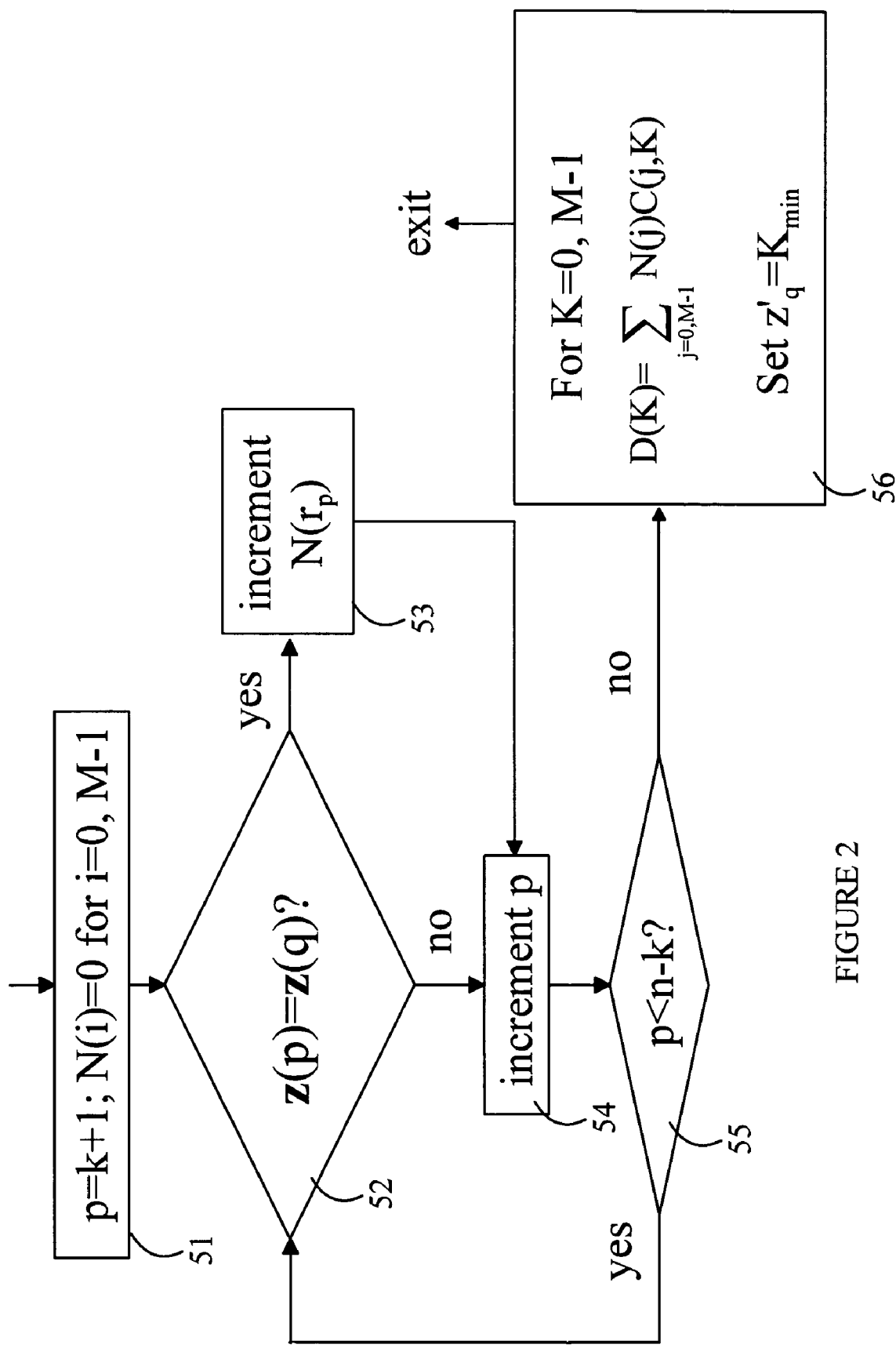
FIG. 2 is a flow chart of the process used to determine the symbol value.

The manner in which the present invention defines the correct symbol to use in place of $z_q$ can be more easily understood with reference to FIG. 2, which is a flow chart of the process used to determine the symbol value. The algorithm can be broken into two parts. In the first part, each subsequence centered at p for which z(p)=z(q) is identified and the number of times the preliminary denoising system outputs each possible value for $r_p$ is determined for each such p. Denote the number of times that $r_p$ was assigned the value j by the preliminary denoising system by N(j) for all of these values of p. The algorithm that implements the first part starts by initializing a number of variables as shown at 51. The algorithm then searches for each sequence for which z(p)=z(q). For the current value of p, the algorithm tests z(p) as shown at 52. If z(p)=z(q), N($r_p$) is incremented as shown at 53. In either case, p is incremented to the next value as shown at 54, and the new value of p is tested to be sure that it is within the permissible range as shown at 55. If there are more subsequences to test, the process is repeated. When all of the subsequences have been examined, the algorithm proceeds to the second part.

In the second part of the algorithm, the counts from the first part are used to estimate the degradation that would result in the signal for the various possible choices of symbol values to which $z_q$ could be changed. Consider the case in which $z_q$ is changed to the value K. The algorithm computes the degradation estimate D(K) as follows:

$$D(K) = \sum_{j=0}^{M-1} N(j)C(j, K) \quad (1)$$

as shown at 56. The algorithm then sets $z'_q$ equal to $K_{min}$, defined as the value of K for which D(K) has the minimum value.

The manner in which the algorithm alters the output of the preliminary denoiser can be more easily understood with reference to a simple example. Consider the case in which the cost of making an error is the same for all errors, i.e., C(I,J)= $C_0$ for all I that are different from J. It should be noted that C(I,I)=0 for all I. In this case, D(K) will be S(K)$C_0$, where S(K) is the sum of N(J) for J different from K. Now assume that N(1)>>N(J) for J different from 1. That is, in the vast majority of the cases, the preliminary denoiser substituted the value 1 for the symbol at the middle of each subsequence equal to z(q) in the noisy signal. In this case, D(K) will have its minimum value for K=1, since all of the other values of D(K) will include N(1) in the S(K) term. Hence, for this degradation function, the algorithm of the present invention sets the output $z'_p$ for all p for which z(p)=z(q) to that value taken on by the majority of the $r_p$, the output of the preliminary denoiser, for such indices p.

The above-described embodiments utilized a 2k long sequence surrounding the symbol being processed to define the 2k+1 symbol reference subsequence whose instances in z and the corresponding symbols in r are examined to determine the output symbol that is to be used in place of the symbol being processed. To simplify the following discussion of the more general cases, it is useful to define a "context" for the symbol being processed. Consider a symbol in the output signal. A subsequence of symbols having fixed values and in a predetermined location with respect to that symbol will be referred to as the "context" of that symbol. In the preceding example, the context of the symbol $z_q$ was the k symbols on each side of $z_q$. Denote the k symbols on the left of $z_q$ by a=$a_1, a_2, \ldots, a_k$ and the k symbols on the right of $z_q$ by b=$b_1, b_2, \ldots, b_k$. Then the reference subsequence used to determine the replacement symbol for $z_q$ can be written as z(q)=a$z_q$b. It should be noted, however, that other contexts can be utilized in the present invention. For example, the sequence ending with the symbol $z_q$, i.e., a$z_q$, could have been utilized. Similarly, the sequence beginning with $z_q$, i.e., $z_q$b, could have been utilized. Furthermore, the lengths of the sequences a and b could be different.

In addition, contexts in which the sequences a and/or b have "wild cards" can also be utilized. That is, a may be written in the form $a_1, a_2, \ldots, a_1, \ldots, a_k$, where $a_w$ can be a string of symbols in which the symbols in the string can take on any value. Similarly, the symbols of the context do not need to be adjacent to the symbol being processed as long as they are in a predetermined location relative to that symbol. The above general definition of the context of a symbol and the induced reference subsequence applies also to multi-dimensional signals such as two-dimensional image data.

Refer again to FIG. 1. In one embodiment of the present invention, z and r are read by denoising system 100. The z sequence is stored in a memory 113 as it is received. For the purposes of this example, it will be assumed that the context of each symbol is the k symbols to the left of that symbol and the k' symbols to the right of that symbol. In the first pass, controller 11 stores the received sequence z in a memory 113 as the symbols are received. Controller 111 also makes a list of all subsequences of length L=k+k'+1 in z. As each symbol is received, controller 111 examines the most recently received L symbols in z to determine the reference subsequence that has just been completed. Assume that the $j^{th}$ symbol in the z sequence has just been received. This symbol completes z(j-k'-1), the reference subsequence associated with the symbol to be processed at j-k'-1.

Controller 111 examines the sequences stored in memory 114 to determine if z(j-k'-1) has been received earlier. If not, controller 111 makes a new entry in memory 114 for the subsequence. The entry includes the L symbols that make up the subsequence and M counters for keeping track of the results from preliminary denoising system 120 for this sequence. Controller 111 then records the preliminary denoising system result in the appropriate counter. That is, controller 111 increments the counter corresponding to the symbol value $r_{j-k'-1}$. When all of the symbols from both of the sequences z and r have been received and processed, the first pass is complete.

In the second pass, controller 111 sequentially goes through the stored z sequence and replaces each symbol with the symbol determined by the algorithm discussed above with reference to FIG. 2. The degradation function is stored in a memory 113 in one embodiment of the present invention. At the beginning and end of the sequence, there is insufficient data to define a context. Hence, the first k symbols and the last k' symbols are set to the corresponding symbols in the r sequence from the preliminary denoising system.

It should be noted that the received signals z and r do not need to be stored in a high-speed memory. At any given time, controller 111 during the first pass needs L symbols from z, and only one symbol from r. Hence, the received signal can be stored on a disk drive with the exception of a small buffer for storing the L symbols currently being utilized. Only the context memory 114 needs to be a high-speed memory.

The above examples assume a value for L has been determined. The present invention provides the greatest benefits in those cases in which the received sequence z has reference subsequences that are repeated a statistically significant number of times so that the counter values corresponding to any such subsequence lead to an accurate characterization of the behavior of the preliminary denoiser. If the number of observed occurrences of the reference subsequences in the received sequence is small, the accuracy of the N(J) counts discussed above might be low, and hence, the accuracy of the estimates D(K) will likewise be low. If the accuracy of these counts is sufficiently low, the wrong decision with respect to correct output symbol will be made.

The number of occurrences of a reference subsequence depends to some degree on the length of the context. Consider the case in which a symbol z having a context of length L−1 is to be processed as described above. Further assume that the corresponding reference subsequence azb, appears Q times where Q>>1 and Q/M>>1, but the longer reference subsequence tazb does not appear frequently for any value of t. Then a reference subsequence that is larger than L will have much fewer occurrences, and the statistical accuracy of the counts will be degraded relative to the case in which the smaller context was used. Hence, choosing too large a value for L can result in decision errors.

For any fixed L, the system can only exploit correlations among L samples or fewer in the input signal. The greater the extent of the input correlation that can be effectively exploited the better the performance. In contrast to the above considerations, this argues against making L too small.

From the above discussion, it is clear that there is an optimum value of L. This optimum can be determined empirically. If the length of the correlated sequences in the input signal does not change markedly over time, an optimum value for L can be determined experimentally by utilizing exemplary input signals and comparing the results of denoising for various values of L.

In principle, L can be determined for any particular output signal by denoising the signal using a number of different L values. In such a system, the value of L can be decreased from some upper bound until a value that provides satisfactory statistical accuracy is found. A reasonable starting value for L is given by [log(n)/log(M)], where n is the number of symbols in the z sequence and M is the number of symbols in the alphabet.

Figure 3:
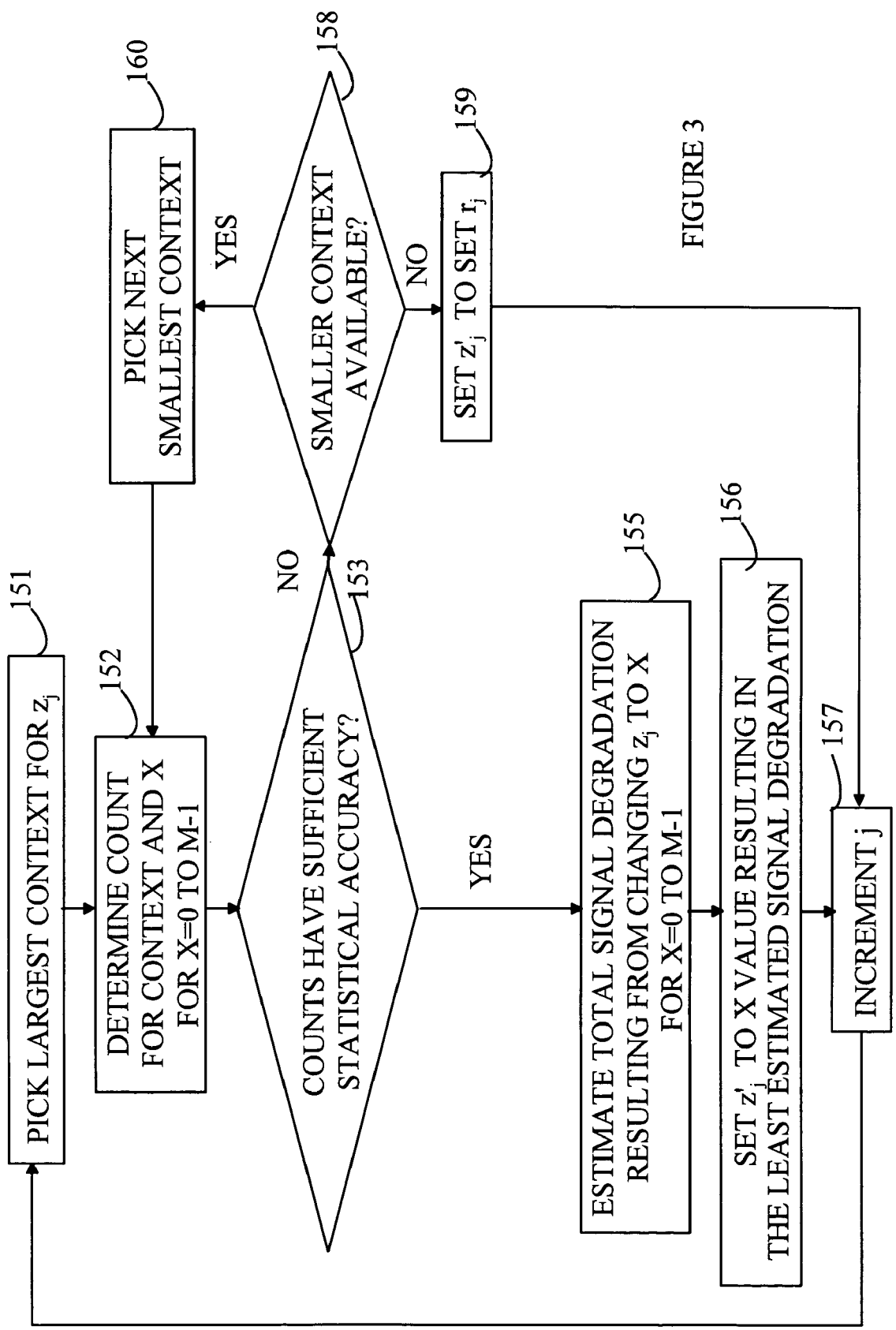
FIG. 3 is a flow chart of the signal processing algorithm used in the second pass.

Refer now to FIG. 3, which is a flow chart of the signal processing algorithm used in the second pass. After the received signal has been stored in memory 113, controller 111 sequentially examines the received symbols to determine if a symbol should be reset to another value. When controller 111 is at $z_j$, controller 111 reads the k symbols on the left of $z_j$ and the k' symbols to the right of $z_j$ to determine the largest reference subsequence z(j) for $z_j$ for which counts have been stored in memory 114 as shown at 151. Controller 111 extracts the counts associated with this reference subsequence from memory 114 as shown at 152 and determines if the stored counts have sufficient statistical accuracy to proceed as shown at 153. If the counts have sufficient accuracy, controller 111 reads the counts stored with z(j) and estimates the signal degradation that would occur if $z_j$ is replaced by each possible symbol value as shown at 155 utilizing Eq. (1) discussed above. The symbol is then set to the value that minimized the degradation as shown at 156.

If the statistical accuracy of the counts for this reference subsequence is too low, controller 111 looks for a smaller context as shown at 158. If such a context is present, the associated reference subsequence is chosen and the process repeated as shown at 160 and 152. If no smaller context is available, $z'_j$ is set to $r_j$, i.e., the value provided by the preliminary denoising system as shown at 159. The process continues by incrementing j as shown at 157 and repeating the process until all of the symbols that are to be processed have been processed. As noted above, the symbols on the ends of the sequence z' that are too close to an end to have a context are set to the values in the corresponding positions in the sequence r.

The above-described embodiments of the present invention have utilized a denoising apparatus that directly processes the received signal and has specific memories for use in storing the various parameters, contexts, and degradation functions. However, the present invention can be practiced on a general-purpose data processing system to which a copy of the received signal from the channel and a copy of the output of the preliminary denoising system have been transferred by loading an appropriate data processing program into that data processing system. Embodiments in which the preliminary denoising system operates on the same data processing system can also be practiced.

The above-described embodiments utilize separate memories for storing the degradation function, list of contexts, and the received signals. However, embodiments in which a single memory is used to store two or more of these quantities can also be constructed without departing from the teachings of the present invention. Accordingly, it is to be understood that the separate memories discussed above can be part of a larger memory.

Various modifications to the present invention will become apparent to those skilled in the art from the foregoing description and accompanying drawings. Accordingly, the present invention is to be limited solely by the scope of the following claims.

What is claimed is:

1. An apparatus for denoising an input noisy signal, the apparatus comprising:
   one or more memories; and
   a controller that
      receives the noisy signal z that includes a number of sequentially ordered symbols, each symbol having a position, stores the noisy signal z in the one or more memories, receives a signal r, output from a preliminary denoising system that operates on the received noisy signal z, that includes a number of sequentially ordered symbols, each symbol having a position, stores the signal r in the one or more memories, and produces an output signal z' by replacing a symbol within each of a number of different subsequences that occur in the noisy signal z with a corresponding replacement symbol that the controller computes to provide a minimal estimated signal degradation.

2. The apparatus of claim 1 wherein the controller produces the output signal z' by:

for each of a number of different symbol subsequences, z(q), about symbol $z_q$, that occur in the received noisy signal z, counting a number of occurrences of each symbol at the corresponding positions p in signal r, $r_p$, for positions p in the received noisy signal z at which z(p) is equal to z(q) and storing the counted number of occurrences in the one or more memories; and for each of the number of symbol subsequences, z(q), in the received noisy signal z, replacing symbol $z_q$ of subsequence z(q) in all occurrences of subsequence z(q), at positions $z_p$, in the noisy signal z with a replacement symbol $z_q'$ which produces a minimal computed signal degradation.

3. The apparatus of claim 2 wherein the one or more memories store:

a degradation function C( ) that ;

the received noisy signal z;

the signal r; and the counts of the number of occurrences of each symbol at the corresponding positions p in signal r, $r_p$, for positions p in the received noisy signal z at which z(p) is equal to z(q).

4. The apparatus of claim 3 wherein the replacement symbol $z_q'$ for symbol $z_q$ of subsequence z(q) is computed as a symbol that is computed to produce a least estimated signal degradation, using the degradation function C( ), when $z_q'$ is substituted for $z_q$ in each occurrence of subsequence z(q) in noisy signal z.

5. The apparatus of claim 4 wherein the estimated signal degradation produced by replacing symbol $z_q$ of each occurrence of subsequence z(q) with symbol $z_q'$ is computed as:

$$\text{degradation} = \sum_p C(r_p, z_q')$$

where $C(r_p, z_q')$ is the degradation estimated for replacing the symbol $r_p$ at position p in the signal r with symbol $z_q'$; and p represents the positions in the signals r and z at which z(p) is equal to z(q).

6. The apparatus of claim 1 wherein a subsequence z(q) is a number of symbols that precede, follow, or both precede and follow a symbol $z_q$ at position g in noisy sequence z.

7. The apparatus of claim 6 in which the number of symbols in a subsequence is determined by the controller to be sufficiently small to ensure that the number of occurrences of each subsequence is sufficiently large to provide a desired statistical significance to signal degradation estimation and sufficiently large to ensure that an adequate number of subsequence correlations contribute to denoising.

8. A method for denoising a noisy signal and partially corrected signal to generate an output signal, the method comprising:

receiving the noisy signal z that includes a number of sequentially ordered symbols, each symbol having a position, storing the noisy signal z in one or more memories, receiving the partially corrected signal r, output from a preliminary denoising system that operates on the received noisy signal z, that includes a number of sequentially ordered symbols, each symbol having a position, storing the partially corrected signal r in the one or more memories, and producing the output signal z' by replacing a symbol within each of a number of different subsequences that occur in the noisy signal z with a corresponding replacement symbol that the controller computes to provide a minimal estimated signal degradation.

9. The method of claim 8 wherein the output signal z' is produced by:

for each of a number of different symbol subsequences, z(q), about symbol $z_q$, that occur in the received noisy signal z, counting a number of occurrences of each symbol at the corresponding positions p in signal r, $r_p$, for positions p in the received noisy signal z at which z(p) is equal to z(q) and storing the counted number of occurrences in the one or more memories; and for each of the number of symbol subsequences, z(q), in the received noisy signal z, replacing symbol $z_q$ of subsequence z(q) in all occurrences of subsequence z(q), $z_p$, in the noisy signal z with a replacement symbol $z_q$ which produces a minimal computed signal degradation.

10. The method of claim 9 further comprising computing the replacement symbol $z_q'$ for symbol $z_q$ of subsequence z(q) as a symbol that produces a least estimated signal degradation, using the degradation function C( ), when $z_q'$ is substituted for $z_q$ in each occurrence of subsequence z(q) in noisy signal z.

11. The method of claim 10 further comprising computing the estimated signal degradation produced by replacing symbol $z_q$ of each occurrence of subsequence z(q) with symbol $z_q'$ as:

$$\text{degradation} = \sum_p C(r_p, z_q')$$

where $C(r_p, z_q')$ is the degradation estimated for replacing the symbol $r_p$ at position p in the signal r with symbol $z_q'$; and p represents the positions in the signals r and z at which z(p) is equal to z(q).

12. The method of claim 8 wherein a subsequence z(q) is a number of symbols that precede, follow, or both precede and follow a symbol $z_q$ at position q in noisy sequence z, the subsequence including symbol $z_q$.

13. The method of claim 8 further comprising determining the number of symbols in a subsequence by selecting the number of symbols in a subsequence to be sufficiently small to ensure that the number of occurrences of each subsequence is sufficiently large to provide a desired statistical significance to signal degradation estimation and to be sufficiently large to ensure that an adequate number of subsequence correlations contribute to signal denoising.

14. A computer readable medium encoded with a data processing program for denoising a noisy signal and a partially corrected signal to generate an output signal by:
   receiving the noisy signal z that includes a number of sequentially ordered symbols, each symbol having a position,
   storing the noisy signal z in one or more memories,
   receiving the partially corrected signal r, output from a preliminary denoising system that operates on the received noisy signal z, that includes a number of sequentially ordered symbols, each symbol having a position,
   storing the partially corrected signal r in the one or more memories, and
   producing the output signal z' by replacing a symbol within each of a number of different subsequences that occur in the noisy signal z with a corresponding replacement symbol that the controller computes to provide a minimal estimated signal degradation.

* * * * *

UNITED STATES PATENT AND TRADEMARK OFFICE
CERTIFICATE OF CORRECTION

PATENT NO. : 7,912,159 B2
APPLICATION NO. : 10/765542
DATED : March 22, 2011
INVENTOR(S) : Itschak Weissman et al.

Page 1 of 1

It is certified that error appears in the above-identified patent and that said Letters Patent is hereby corrected as shown below:

In column 7, line 60, in Claim 6, delete "g" and insert -- q --, therefor.

In column 8, line 34, in Claim 9, delete "$z_q$" and insert -- $z'_q$ --, therefor.

Signed and Sealed this
Twenty-fifth Day of September, 2012

David J. Kappos
*Director of the United States Patent and Trademark Office*